(12) United States Patent
Schlittmeier et al.

(10) Patent No.: US 9,198,315 B2
(45) Date of Patent: Nov. 24, 2015

(54) COVER FOR A PORTABLE MIXER AMPLIFIER

(75) Inventors: Thomas Schlittmeier, Altdorf (DE); Josef Taffner, Donaustauf (DE); Gregor Sauer, Butzbach-Griedel (DE); Alfred Brunhofer, Grafenwiesen (DE)

(73) Assignee: Robert Bosch GmbH, Stuttgart (DE)

( * ) Notice: Subject to any disclaimer, the term of this patent is extended or adjusted under 35 U.S.C. 154(b) by 338 days.

(21) Appl. No.: 13/822,065

(22) PCT Filed: Sep. 7, 2011

(86) PCT No.: PCT/EP2011/065425
§ 371 (c)(1),
(2), (4) Date: Mar. 11, 2013

(87) PCT Pub. No.: WO2012/032070
PCT Pub. Date: Mar. 15, 2012

(65) Prior Publication Data
US 2013/0170671 A1 Jul. 4, 2013

(30) Foreign Application Priority Data
Sep. 10, 2010 (DE) .......................... 10 2010 040 533

(51) Int. Cl.
| | | |
|---|---|---|
| *H04B 1/00* | (2006.01) | |
| *G10H 1/00* | (2006.01) | |
| *G09F 27/00* | (2006.01) | |
| *H05K 5/03* | (2006.01) | |
| *H05K 5/02* | (2006.01) | |
| *H05K 5/00* | (2006.01) | |
| *H04H 60/05* | (2008.01) | |

(52) U.S. Cl.
CPC ................ *H05K 5/03* (2013.01); *H05K 5/0239* (2013.01); *H04H 60/05* (2013.01); *H05K 5/0086* (2013.01)

(58) Field of Classification Search
CPC ......... H05K 5/00; H05K 5/0086; H05K 5/03; H05K 5/02239; H04H 60/05
USPC .......................................... 381/119, 124, 118
See application file for complete search history.

(56) References Cited

U.S. PATENT DOCUMENTS 5,396,398 A * 3/1995 Gill ........................ 361/679.01
6,409,042 B1 * 6/2002 Hirano et al. ................. 220/812

FOREIGN PATENT DOCUMENTS

| CN | 1590233 | 3/2005 |
|---|---|---|
| CN | 2738252 | 11/2005 |

(Continued)

OTHER PUBLICATIONS

International Search Report for Application No. PCT/EP2011/065425 dated Dec. 19, 2011 (2 pages).

*Primary Examiner* — Vivian Chin
*Assistant Examiner* — Douglas Suthers
(74) *Attorney, Agent, or Firm* — Michael Best & Friedrich LLP

(57) ABSTRACT

The invention relates to a cover (2) for a portable electronic mixer amplifier (1), said cover (2) comprising at least: a cover shell (4) having a front side (4.1) and a rear side for being mounted on a lower device part (3) of the mixer amplifier (1), closure devices (8) for locking the cover (2) to the lower device part (3), wherein the closure devices (8) can be adjusted between an open and a locked position. According to the invention, the cover (2) comprises a carrying device (6) which allows a user to carry the device, and closure recesses (10) are designed in the cover shell (4) in which the closure devices (8) are accommodated. The closure recesses, in particular actuatable closure parts (20), are preferably aligned in the locked position with the front side (4.1) of the cover shell and protrude when in the open position.

21 Claims, 7 Drawing Sheets

(56) References Cited

FOREIGN PATENT DOCUMENTS

| | | |
|---|---|---|
| CN | 101464675 | 6/2009 |
| CN | 201272187 | 7/2009 |
| DE | 20019002 | 3/2011 |
| JP | S6047033 | 4/1985 |
| JP | S6221578 | 2/1987 |
| JP | 63-147875 | 9/1988 |
| JP | 2003156013 | 5/2003 |
| WO | 2007110576 | 10/2007 |

* cited by examiner

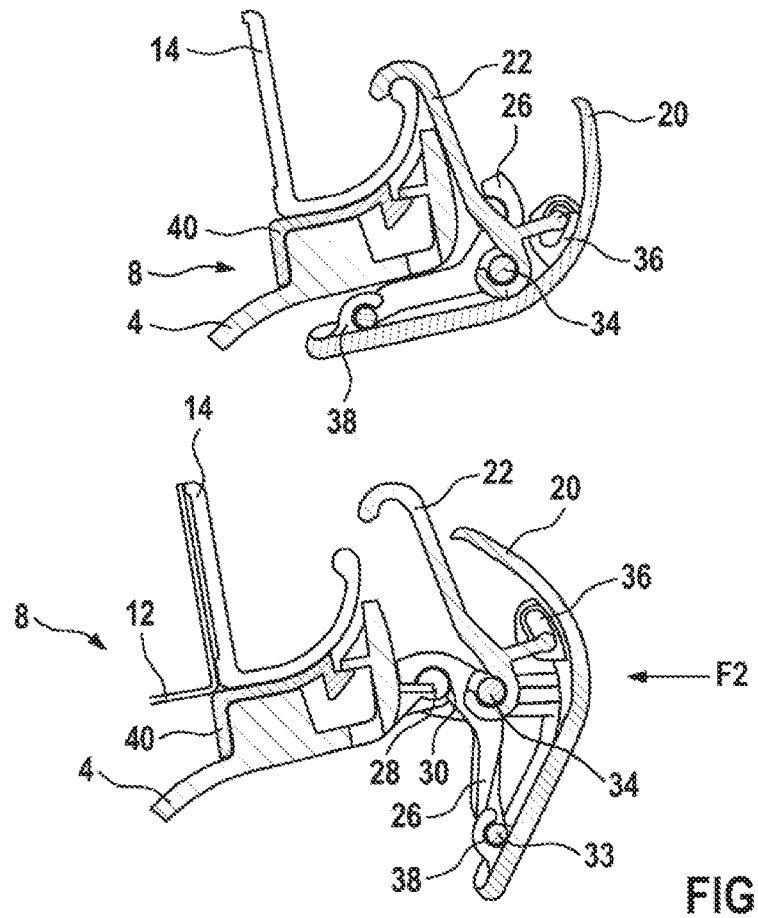
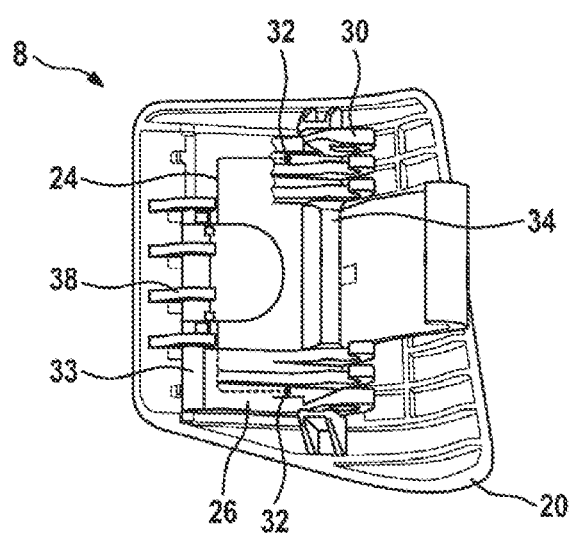
FIG. 8
FIG. 9

COVER FOR A PORTABLE MIXER AMPLIFIER

BACKGROUND OF THE INVENTION

Mixer amplifiers generally have audio inputs or respectively auto input channels for receiving electrical signals of different audio sources, e.g. from microphones and electrical instruments. The different audio inputs can be consecutively individually amplified, formed and suitably mixed, wherein besides different mixing ratios single playbacks can also be adjusted. In principle, a mixer amplifier already has suitable amplifier stages, and therefore loud speakers can be directly connected to the mixer amplifier. The WIPO patent specification WO 2007/110576 A1 describes a sound mixing console comprising suitable terminals and operator controls.

The electronic components of mixer amplifiers are generally accommodated in the lower device part, which has a plurality of connector sockets and actuating devices, e.g. faders and rotary potentiometers. These components are substantially fastened to the large-area front side of the lower device part and are very sensitive to mechanical damage and the exposure to dust and liquid so that a cover is generally mounted to the lower device part. A carrying device is furthermore generally provided on the lower device part, e.g. as a lateral recessed grip in a lateral surface of said lower device part so that it does not disruptively protrude.

The cover is generally designed as a sheet metal cover and is fitted to the front side of the lower device part. The sheet metal cover can, e.g., be locked via two openings on the front panel of the lower device part. The cover is thereby removed prior to use and the lower device part is suitably situated.

Said openings for locking the sheet metal cover in the otherwise closed surface of the front panel of the lower device part however impair the design and the options for shaping. Such configurations of a front panel comprising suitable openings are furthermore in part complicated to manufacture and can impair the internal construction design. The lateral recessed grip also impairs the options for shaping and design of the unit as well as the internal design thereof. Flat configurations of the lower device part are furthermore in part problematic. Because a plurality of operating devices as well as terminals are generally provided on the front side of the lower device part and further terminals, e.g. outputs are provided on the lateral surfaces or the front panel, room is limited for the carrying device.

SUMMARY OF THE INVENTION

According to the invention, a cover (covering) for a portable mixer amplifier is created which already comprises a carrying device. The carrying device can therefore be omitted on the lower device part, i.e. on the actually functional component of the mixer amplifier.

Several advantages are already thereby achieved.

The carrying device can now be totally eliminated from the lower part of the device, and therefore said lower device part can be freely dimensioned and be freely designed with respect to the terminals or respectively effective surfaces thereof. The lower device part can thus be designed differently with respect to the height thereof, e.g. flatter. Furthermore, the carrying device can be designed more comfortably, in particular as a grip comprising a freestanding handle, and thus an easier handling is facilitated than, e.g., is the case with a recessed grip.

Because the cover can be removed prior to use, the carrying device no longer interferes with the subsequent use of the lower device part.

In so doing, a more appealing design of the lower device part is facilitated.

According to the invention, the carrying device and two closure devices, which enable a positive locking of the cover to the lower device part, are preferably provided on a front side of the cover. All of the haptic elements are therefore provided on this side or respectively handle side. The carrying device can particularly be arranged between the closure devices. The introduction of force thus takes place by means of the carrying force of the user via the closure devices as well as directly and symmetrically, respectively on both sides, to the adjoining closure devices.

The integration of the closure devices into the cover advantageously occurs by means of the configuration of suitable closure recesses in the cover shell. The closure devices can particularly be completely accommodated in the closure recesses and therefore no longer disruptively protrude.

The closure devices preferably have in each case a locking piece, which, e.g., can be actuated and moved by the user with, e.g., one finger, via gripping surfaces, ie. surfaces having a gripping capacity. The gripping surfaces can, e.g., be roughened, e.g., by a stamping comprising parallel webs.

According to a particularly preferred embodiment, the locking piece is fitted in the locked position to the shape of the cover shell, i.e. said locking piece does not disruptively protrude here. To this end, said locking piece can align particularly with the cover shell. In so doing, the closure recesses in the cover shell are fitted to the height of the locked closure devices. On the one hand, an appealing design is thereby achieved. It is furthermore advantageous that this locked position can be easily recognized by the user. This is due to the fact that the surface of the locking piece aligns with the front side of the cover shell, i.e. does not protrude beyond said front side. A locked position can therefore be reliably recognized. A further advantage of this aligned or integrated accommodation is based on the fact that the closure device cannot get caught on protruding objects during transport and thus cannot be unintentionally detached.

In the open or respectively unlocked position, the locking piece in contrast protrudes, and therefore said unlocked position is reliably signaled to the user. For this purpose, a spring device, which is preloaded into the open position, can be provided in the closure device. When unlocking said closure device, the locking piece thus in each case completely snaps into the unlocked position, and therefore said unlocked position is reliably recognized by the user.

According to the invention, further advantages result from the aforementioned features. A simple mounting of the cover is possible, wherein said cover can be locked by actuating the closure device, in particular by simply moving or pulling the locking piece using one finger. In order to unlock said cover, the user thus moves the locking piece, particularly toward the front end. In the opened position, the locking piece protrudes at the front end so that the user can push said locking piece in again, whereby a locking of the cover results.

The front side can be either planar or also slightly arched in order to create a suitable design. Said front side is adjoined, e.g., by one or two lateral surfaces and a rear side which wraps around the lower device part.

According to one advantageous embodiment, the cover has a cover shell consisting of a plastic material, e.g. a PC/ABS material that can be subjected to stress. The cover shell can particularly be manufactured as a plastic injection molded part.

The embodiment consisting of plastic material enables additional advantages:

An appealing industrial design can be achieved. The manufacturing costs are particularly low if the cover shell is designed as an injection molded part. The weight can be reduced in comparison to a sheet metal part. A secure covering and a reliable protection against dust and mechanical damage can nevertheless be achieved as before. The loading capacity and the admissible temperature range are particularly improved in the case of PC/ABS material. The cover shell can be subjected to a load of approximately 90 kg in a temperature range of −20° C. to +60° C. without additional damage occurring. The cover shell can be designed to comprise a suitable thickness in the respective ranges so that said shell has a greater mechanical load capacity in comparison to a sheet metal cover. The surface of the cover shell can be suitably designed without additional varnishing or coating. During the injection molding process, decorations and inscriptions can possibly be directly configured in the cover shell, in particular in the large-area front side.

The locking piece can particularly be manufactured from the same material as the cover shell. In so doing, an appealing design can on the one hand be achieved and furthermore the closed position can again be readily recognized.

Every closure device advantageously comprises a frame part in addition to the locking piece, said frame part being provided between said locking piece and the cover shell. Said frame part thereby acts as a coupler or coupling member, which on the ends thereof is connected on the one side to the cover shell and on the other side to the locking piece in an articulated manner. The frame part can also particularly serve to connect the spring which pushes against the locking piece. The preload between the frame part serving as a coupler and the locking piece is therefore formed. According to a preferred embodiment, the frame part can furthermore serve to connect an engagement device, which snaps into the lower device part, e.g. into the front bar thereof, in a positive locking manner. This engagement device can particularly be a pivotable hook. The hook can thereby be coupled on the one hand to the frame part in an articulated manner and on the other hand be guided along the locking piece in an advantageous and complementary manner, e.g. in a slotted hole of said locking piece. A reliable mechanical guidance is achieved at two points by means of this additional guidance. Furthermore, a slotted hole advantageously serves to establish end points for the pivoting motion of the hook.

When locking the cover, the hook can particularly snap in such that an acoustically audible sound, i.e. in particular a clicking sound, occurs. The snapping-in process or respectively the locking of the cover is signaled to the user on the one hand by the mechanical latching, which said user can sense when actuating the locking piece, and also on the other hand in a complementary manner by the audible sound.

When designing the carrying device as a handle, the cover shell can extend into the handle, in particular also into a gripping loop of the handle. The handle therefore comprises a gripping region, which is designed as part of the cover shell. A high mechanical load capacity and stability is thereby achieved because the handle is therefore integrally configured with the entire cover shell. The handle is also consequently designed so that it cannot be lost. The entire mixer amplifier therefore forms a compact unit, wherein the user can comfortably grasp the handle by said user, e.g. placing his or her hand through the handle hole and grasping the gripping loop. The gripping region of the cover shell advantageously extends into said loop. Such an embodiment of the cover shell comprising a hole such that the cover shell extends into said gripping loop is readily possible when embodied as an injection molded part having an injection direction from the front side or with additional sliders.

As a supplement thereto, a handle shell as a further component is advantageously fastened from below to the gripping region of the cover shell, e.g. by means of screws. A significant increase in the carrying comfort is achieved by the use of an additional soft material part, e.g. a rubber grip, which, e.g., can be placed at or between the handle shell and the gripping region. In so doing, reliable, appealing haptics having relatively few components is achieved.

BRIEF DESCRIPTION OF THE DRAWINGS

FIG. 8 shows enlargements of the sections through the closure devices from FIG. 7;

FIG. 9 shows a bottom view of the closure device;

DETAILED DESCRIPTION

Figure 6:
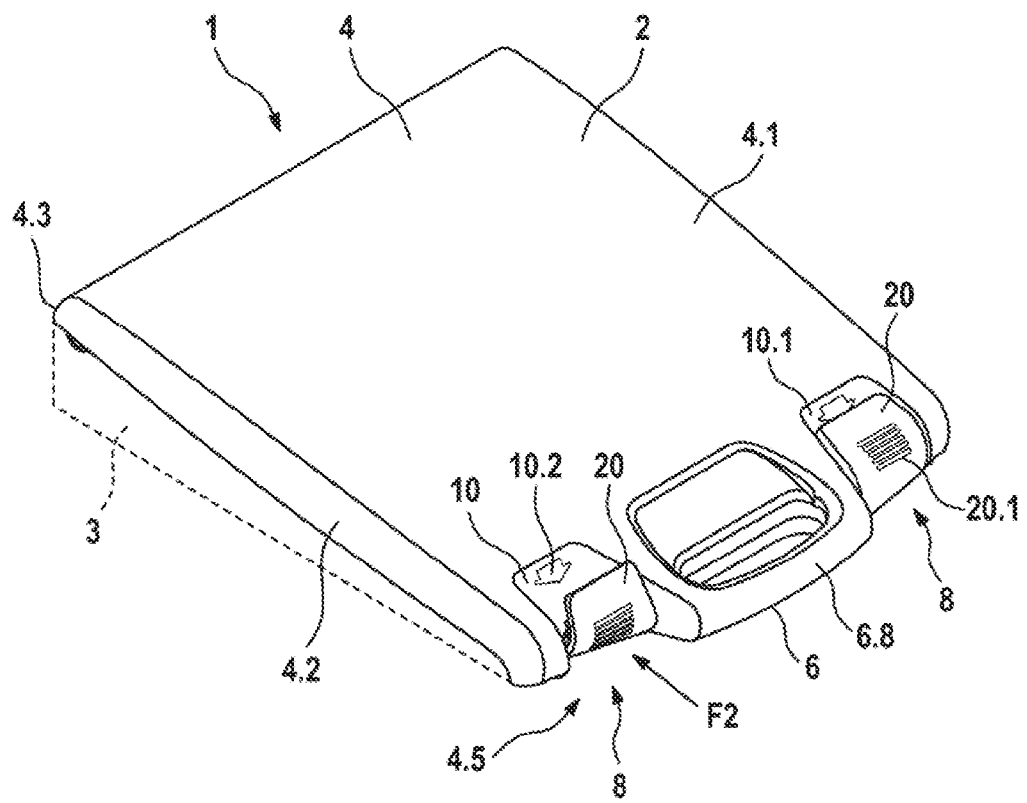
FIG. 6 shows a perspective view of the cover having a closure device open on one side.

A portable mixer amplifier 1 is indicated in FIG. 6 and comprises a cover 2 according to the invention and a lower device part 3 which is indicated with a dashed line. The lower device part 3 is known as such having the functionality of a mixer amplifier and comprises operating devices for mixing tones as well as terminals, said devices and terminals needing to be protected or respectively covered.

Figure 1:
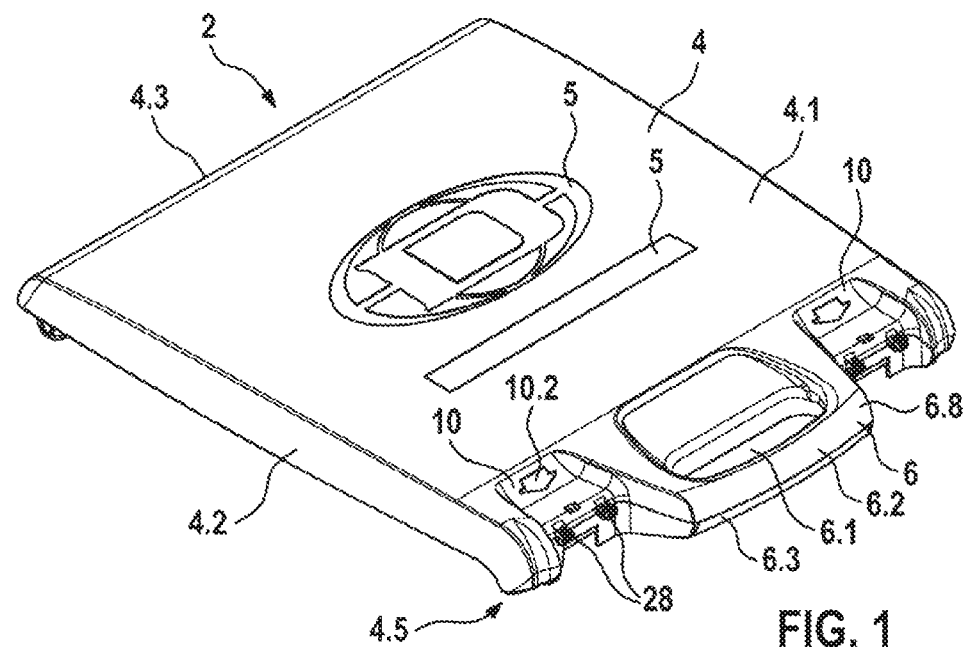
FIG. 1 shows a perspective view of a cover shell of a cover according to the invention without closure devices.
Figure 10:
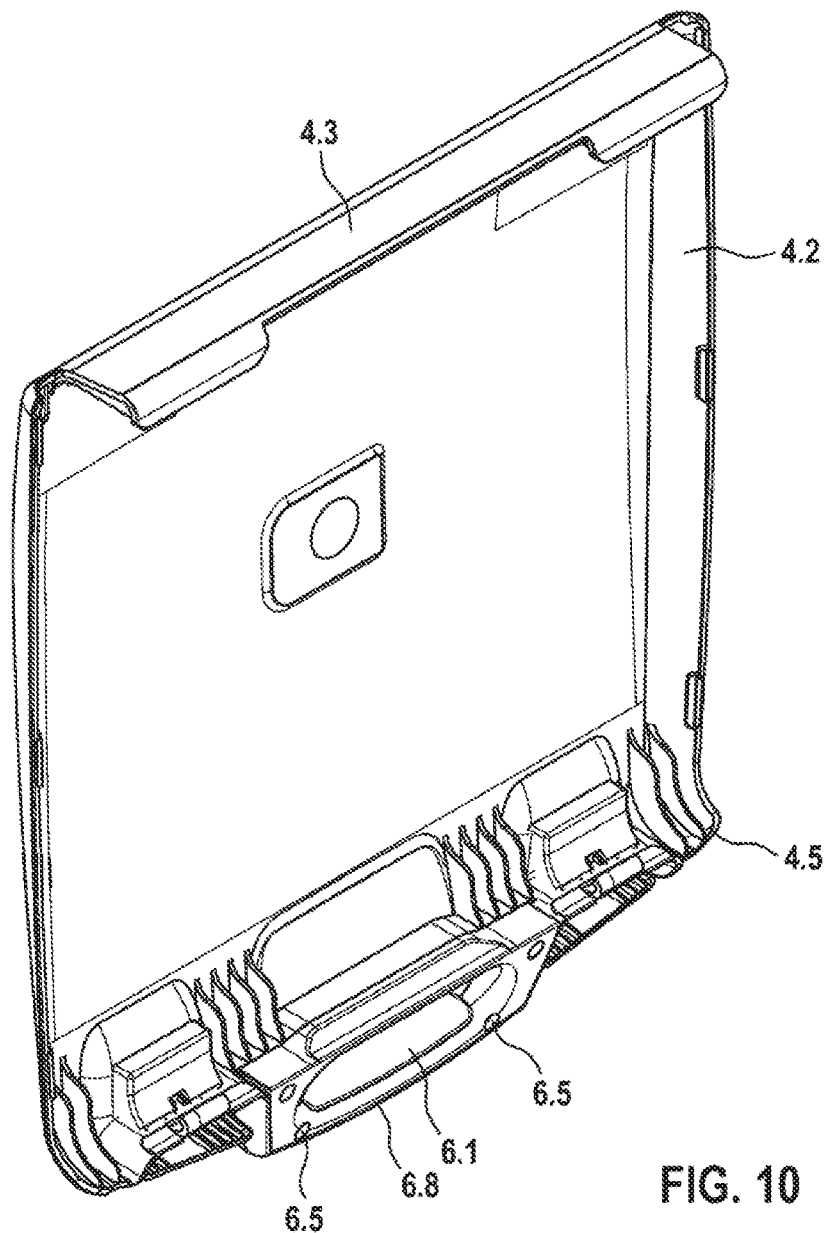
FIG. 10 shows a perspective bottom view of the cover shell.

The cover 2 comprises a cover shell 4, which, e.g., can be seen in FIG. 1 and is manufactured as one piece as a plastic injection molded part consisting of PC/ABS material (polycarbonate acrylonitrile butadiene styrene polymer) and is therefore impact resistant and fracture resistant. Said cover shell is, e.g., durable in a temperature range from −20° to 60° C. The cover shell 4 has a planar or slightly arched front side 4.1, in which stampings 5 (recesses or elevations) can be configured if need be during the injection molding process, said stampings being able to serve as identification and as the case may be as decorations, The cover shell further comprises one or two lateral surfaces 4.2, a rear lateral side 4.3 and a front side (handle side) 4.5 opposite thereto. A back side is half open and serves to mount said cover shell onto the lower device part 3. Said back side is shown in more detail in FIG. 10.

The cover 2 according to the invention further comprises a handle 6 as a carrying device on the front side 4.5, wherein the handle 6 has a gripping loop 6.8 and completely encompasses a grip hole 6.1. The handle 6 can therefore be grasped and carried by an individual with one hand. Besides the handle 6, two closure devices 8 are configured, which are inserted into closure recesses 10 in the cover shell 4. Symbols, in particular arrows, can be configured as stampings 10.2 in the closure recesses 10, especially to indicate an actuating direction.

Figure 11:
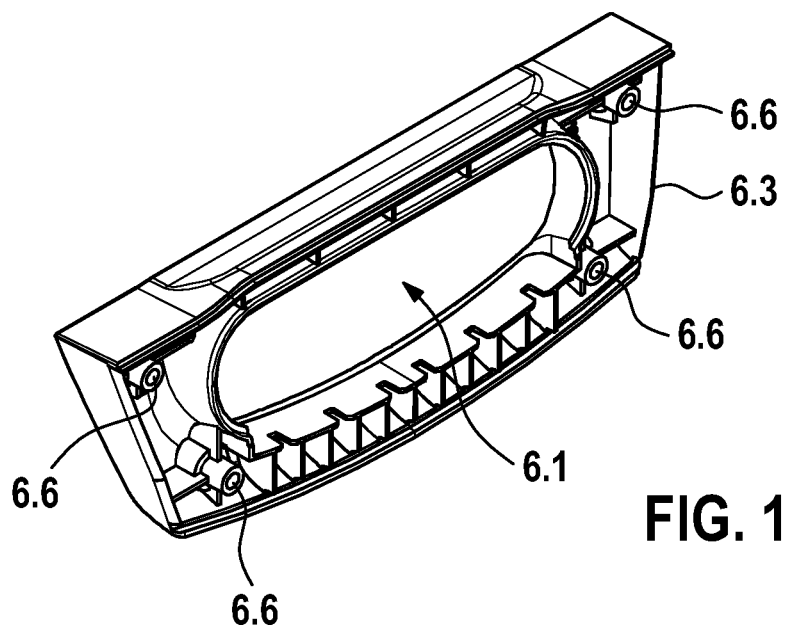
FIG. 11 shows a perspective view of the handle shell.
Figure 12:
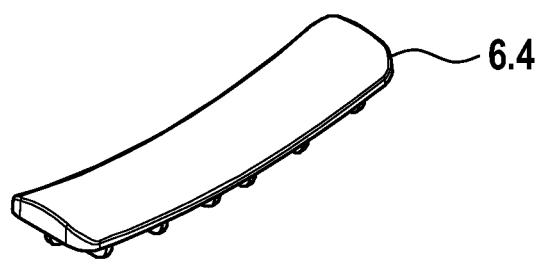
FIG. 12 shows a perspective view of the rubber grip.

The handle 6 is formed by an upper gripping region 6.2, which is a part of the cover shell 4, and furthermore by a handle shell 6.3, which is screwed from below to the gripping region 6.2 and is shown in FIG. 11, as well as by an inserted rubber grip 6.4 shown in FIG. 12. The handle shell 6.3 and the rubber grip 6.4 are therefore additional parts, which are connected to the gripping region 6.2 of the cover shell 4. In the bottom view (rear view) of FIG. 10, the screw holes 6.5 in the gripping region 6.2 can be seen. Corresponding screw holes or respectively screw bosses 6.6 of the handle shell 6.3 can be seen in FIG. 11, wherein the screw holes 6.5 align with the screw bosses 6.6 so that screws, e.g. plastic screws, can be screwed in from below to fasten the handle shell 6.3. The rubber grip 6.4 serves to line the inner side of the handle 6 in the region of the loop 6.8 in order to produce a pleasant, supple gripping sensation for the user and therefore to achieve a pleasant feel. For that reason, the rubber grip is accommodated, e.g., between the handle shell 6.3 and the gripping region 6.2 or alternatively only in the gripping region 6.2.

Figure 7:
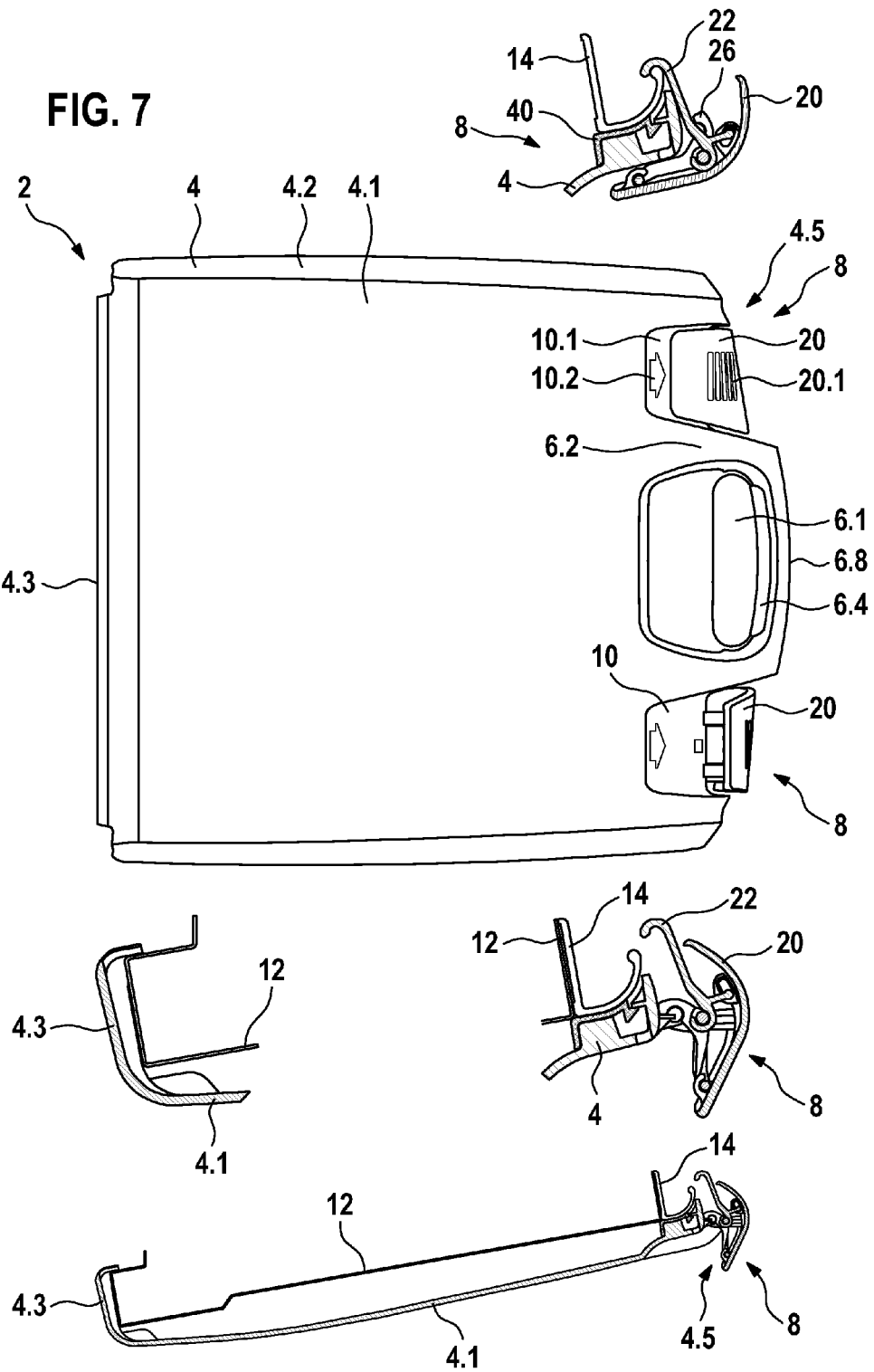
FIG. 7 shows a top view of the cover from FIG. 6 as well as sectional views of the cover through the closure device in the open position on the bottom and the closed position on the top.

The closure devices 8 are show at the bottom of FIG. 7 in the opened state and at the top in the closed state. The design and functionality of said closure devices can especially be seen in the enlarged sectional views of FIG. 8 and in the bottom view of FIG. 9.

A front plate 12 as well as a (non-hatched) front jaw 14 of the lower device part 3 can at first be seen in the sectional view of FIG. 7. In order to mount the cover 2, said cover 2 is slid from the back side, i.e. in FIG. 7 from the left, onto the lower device part 3 or rather the front plate 12 thereof so that the rear lateral surface 4.3 of the cover shell 4 wraps around the front plate 12. The cover shell 4 is thereby fitted in the front region thereof, i.e. on the right side in FIG. 7, to said front plate 12, and therefore the closure devices 8 can be manually latched by the user.

Figure 2:
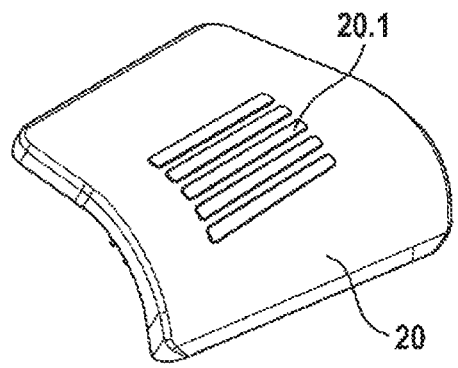
FIG. 2 shows a perspective view of a locking piece of the closure device.

Each closure device 8 comprises a locking piece 20 shown in FIG. 2, which is preferably manufactured from the same plastic as the cover shell 4 and also has particularly the same surface conditions and color scheme as said cover shell in order to align with the front side 4.1 of said cover shell 4 in the closed state. The curvature of the locking piece 20 corresponds in this case to the curvature of said cover shell 4 in this region, i.e. in the region towards the front side (handle side), and thus said locking piece 20 conforms to the shape of said front side 4.1. As can be seen in FIGS. 6 and 7, a rear portion 10.1 of the closure recess 10 is not covered by said locking piece 20 in the closed (locked) position thereof, the stamping 10.2 for the marking which indicates the actuating direction being provided in said rear portion 10.1.

The locking piece 20 can have a gripping surface 20.1 which increases the roughness on the top side thereof, e.g. by means of webs or projections 20.1 or appropriate shapings, in order for the user using one finger or his or her thumb to better grip and actuate the handle via said gripping surfaces 20.1.

Figure 3:
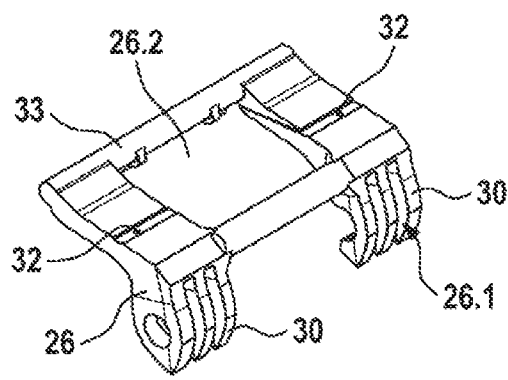
FIG. 3 shows a perspective view of a frame part of the closure device.
Figure 4:
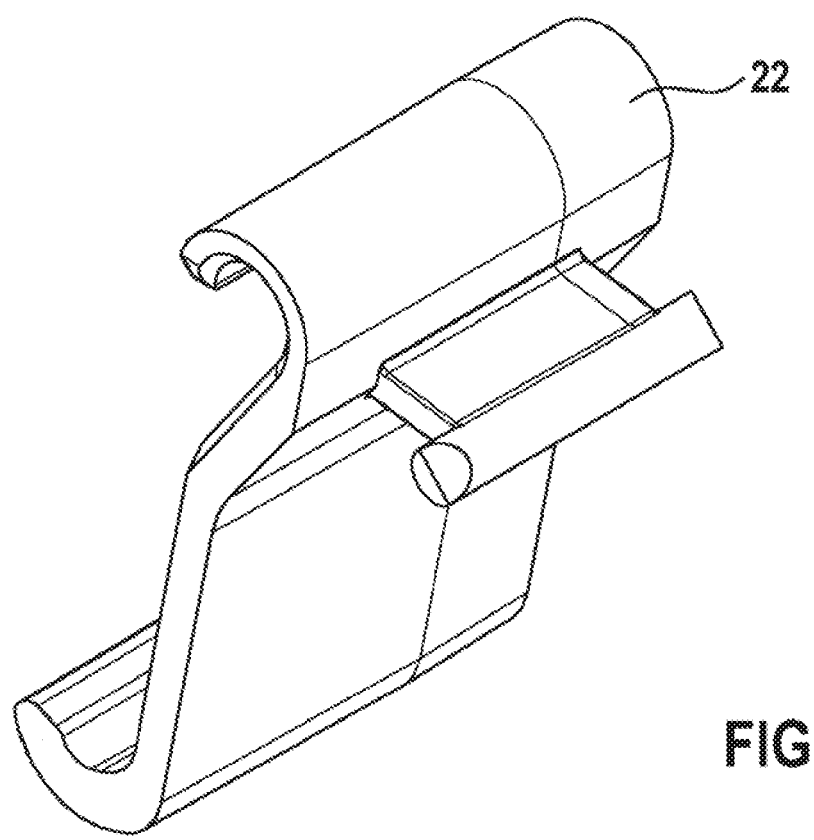
FIG. 4 shows a perspective view of a hook of the closure device.
Figure 5:
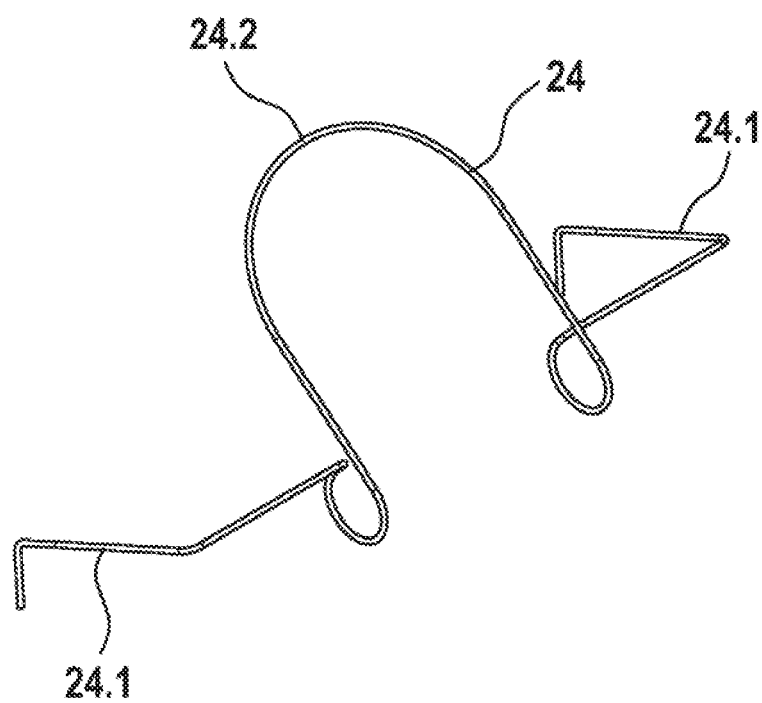
FIG. 5 shows a perspective view of a spring of the closure device.

Besides the locking piece 20, the closure device 8 further comprises a hook 22 consisting of plastic (or also metal), which is shown in more detail in FIG. 4, a spring 24 made from metal shown in FIG. 5 and a frame part 26 shown in FIG. 3. These components are assembled according to the sectional views:

The frame part 26 serves on the one hand as a coupler between the locking piece 20 and the cover shell 4 and on the other hand to receive the hook 22 as is described in detail below:

Two axes 28 are configured in each case in the closure recess 10 of the cover shell 4, which protrude somewhat as a part of the plastic injection molding material. The axes 28 serve to pivotably connect the axis seats 30 of the frame part 26, which is thereby pivotably mounted. The axes 28 comprise laterally running pivot pin regions, e.g. supplementary lamellar webs, which engage in corresponding slots 26.1 of the frame part 26. During assembly, the axes 28 thus snap into the axis seats 30 of the frame part 26. This is accomplished, for example, according to FIG. 3 by the right axis seat 30 being half open and the left axis seat 30 being closed, and therefore the left axis 28 according to FIG. 1 of the left closure device 28 is inserted into the closed axis seat 30. Using a pivoting motion, the right axis 28 can subsequently be snapped into the half open axis seat 30. In this way, a simple assembly step is ensured.

As can be seen in FIG. 3, the frame part 26 has two holes 32 on the upper side thereof. The spring 24 has contact tongues 24.1, which are inserted into the holes 32 with the ends thereof, and a central contact area (curved area) 24.2 which serves in contacting the inner side of the locking piece 20, as can particularly be seen in FIG. 9. The spring 24 is advantageously of symmetrical design. Said spring 24 therefore rests with the contact tongues 24.1 thereof against the side of the frame part 26, which is the upper side in FIG. 3, and extends with the central contact area 24.2 thereof through a hole 26.2 in the center of the frame part 26 in order to rest against the locking piece 20 and to develop a spring effect between said locking piece 20 and said frame part 26.

The hook 22 serves to lock the cover to the front bar 14 of the lower device part 3 as can be seen in FIG. 8. In so doing, the hook 22 is pivotably mounted in a hook axis 34 which is configured as part of the frame part 26. The hook 22 therefore pivots about the frame part 26, wherein said hook 22 is furthermore guided in a slotted hole 36 which is configured in the locking piece 20 or respectively as part of said locking piece 20. The slotted hole 36 serves on the one hand to guide the hook 22 in order that in addition to the hook axis 34, said hook 22 is guided in a wider range and consequently in a more reliable manner. On the other hand, said slotted hole 36 serves to limit the pivoting motion of said hook 22 in order to avoid damage thereto. The job of the spring 24 is to push said hook 22 away from the front bar 14 and to hold the closure device 8 in the open position. This action of said spring can be visually observed by the user.

The frame part 26 is advantageously mounted, e.g., in an axis attachment (e.g. lug) 38 of the locking piece 20, as, e.g., can be seen in the upper illustration in FIG. 8. In FIG. 8, the frame part 26 can therefore be recognized at two points by the tight hatching in the sectional area thereof, namely at the hook axis 34 for receiving the hook 22 and at the axis region 33 thereof, with which said frame part is mounted in the axis seat 38 of the locking piece 20.

According to FIG. 8, a rubber insert 40 (tight hatching) can be inserted between the front bar 14 of the lower device part 3 and the cover shell 4, wherein said insert snaps in place in a positive locking manner or can also be adhesively bonded to the cover shell 4 in order to serve as cushioning or as a shock absorber when fitting the cover 2 to the lower device part 3.

The adjusting kinematics can therefore be recognized particularly from the two depictions of FIG. 8: starting at the upper locked position of the closure device 8, the user actuates the locking piece 20 by reaching into the portion 10.1 of the closure recess 10 lying open in the rear and pressing the locking piece 20 from the rear forwards in the direction of force of FIG. 1, i.e. to the right in FIG. 8. The frame part 26 swings with the axis seat 30 thereof about the axis 28 of the cover shell and is mounted with the axis region 33 thereof in the axis seat 38 of the locking piece 20, and therefore the locking piece 20 together with the frame part 26 acting as a coupling member pivots about the cover shell 4. In this case, the locking piece 20 pursuant to FIG. 8, lower illustration, pivots upwardly away in the region of the axis seat 38 thereof, i.e. in the region of the back end thereof. Hence, the open position of FIG. 8, lower illustration, can be clearly recognized by the user. The spring preload of the spring 24 presses into the open position of FIG. 8, lower illustration, so that this open position which is depicted in the lower illustration of FIG. 8 and is easily recognizable for the user, is achieved even in the case of partial unlocking. When this pivoting action occurs, the frame piece 26 and therefore also the hook axis 34 adjust conjointly; thus enabling the hook 22 in FIG. 8 to move to the right and out of engagement with the front jaw 14.

In order to lock the cover, the locking piece 20 of FIG. 8 is in turn grasped by the user starting from below, e.g., on the gripping surfaces 20.1 thereof and pushed in the direction of the force arrow F2, i.e. in FIGS. 7 and 8 toward the left. By means of this force F2, the hook 22 is in turn pushed against the front bar 14 and catches hold of the same so that the closure device 8 is moved in reversed kinematic motion until the locked position of FIG. 8 (upper illustration) is achieved. Upon achieving the locked position of FIG. 8 (upper illustration), a clicking sound is advantageously produced, e.g., as a result of the impact of the locking piece 20.

The user can actuate the two closure devices 8 separately or also at the same time. An open position can be easily recognized due to the no longer aligned, protruding position of the locking piece 20 pursuant to the illustration in, e.g., FIG. 6 on the left. The locked position is also easily recognizable due to the aligned fit of the locking piece 20 on the front side 4.1.

The assembly of the closure devices 8 during manufacture is relatively simple. The spring 24 is placed with the contact tongues 24.1 thereof in the holes 32 of the frame part 26. The frame part 26 is (prior to and after mounting the spring 24) mounted (clipped) in the axis seat 38 of the locking piece 20. The hook 22 is in turn hooked into the hook seat 34 of the frame part 26, wherein these assembly steps could also in principle occur in another order. What is relevant here is the configuration of a combined closure mechanism or respectively the closure device 8, which subsequently can be mounted on the cover shell 4 by the frame part 26 with the axis seat 30 thereof being mounted in the axis 28 of the cover shell 4. Said mounting of the axes takes place in each case with an engagement procedure and is therefore assured to stay in place.

In order to fasten the cover 2 to the lower device part 3, the cover 2 is initially mounted with the rear lateral surface 4.3 thereof to the front plate 12 of said lower device part 3, and then laid with the handle side onto the front jaw 14 of said lower device part 3, wherein a cushioning or shock absorbtion is achieved by means of the rubber insert 40. The closure devices 8 can subsequently be separately locked.

What is claimed is:

1. A cover (2) for a portable electronic mixer amplifier (1), said cover (2) comprising at least: a cover shell (4) having a front side (4.1) and a rear side for being mounted on a lower device part (3) of the mixer amplifier (1), closure devices (8) for locking the cover (2) to the lower device part (3), wherein the closure devices (8) can be adjusted between an open and a locked position, characterized in that the cover (2) comprises a carrying device (6) which allows a user to carry the device, and the cover shell having therein closure recesses (10) in which the closure devices (8) are accommodated, characterized in that the closure devices (8) are accommodated in the closure recesses (10) in such a way that a locked closure device (8) substantially aligns with the front side (4.1) of the cover shell (4) or does not protrude beyond said front side (4.1), and an unlocked closure device (8) protrudes beyond said front side (4.1) of the cover shell (4), characterized in that the closure devices (8) in each case comprise a locking piece (20), which has a gripping surface (20.1) for manipulation by the user and is configured on an upper side thereof with a design corresponding to the front side (4.1) of the cover shell (4), wherein the locking piece (20) aligns with said front side (4.1) of said cover shell (4) in the closed position of the closure device (8) and in the open position of said closure device (8) protrudes beyond said front side (4.1), characterized in that each closure device (8) further comprises a frame part (26), which is arranged as a coupling member between the cover shell (4) and the locking piece (20) and is connected to them respectively in an articulated manner, characterized in that each closure device (8) comprises an engagement device (22) for a positive locking engagement with the lower device part (3) in the locked position, wherein the engagement device when being adjusted into the locked position snaps into place while producing an acoustic sound, characterized in that the engagement device is designed as a pivotable hook (22) and articulates with a coupling member (26), and characterized in that the hook (22) is additionally guided on the locking piece (20) in order to provide guidance support and define a maximum pivoting range.

2. The cover according to claim 1, characterized in that the cover shell (4) is manufactured from a polycarbonate acrylonitrile butadiene styrene polymer, by means of an injection molding process.

3. A cover (2) for a portable electronic mixer amplifier (1), said cover (2) comprising at least: a cover shell (4) having a front side (4.1) and a rear side for being mounted on a lower device part (3) of the mixer amplifier (1), closure devices (8) for locking the cover (2) to the lower device part (3), wherein the closure devices (8) can be adjusted between an open and a locked position, characterized in that the cover (2) comprises a carrying device (6) which allows a user to carry the device, and the cover shell having therein closure recesses (10) in which the closure devices (8) are accommodated, characterized in that the closure devices (8) are accommodated in the closure recesses (10) in such a way that a locked closure device (8) substantially aligns with the front side (4.1) of the cover shell (4) or does not protrude beyond said front side (4.1), and an unlocked closure device (8) protrudes beyond said front side (4.1) of the cover shell (4), and characterized in that the closure devices (8) in each case comprise a locking piece (20), which has a gripping surface (20.1) for manipulation by the user and is configured on an upper side thereof with a design corresponding to the front side (4.1) of the cover shell (4), wherein the locking piece (20) aligns with said front side (4.1) of said cover shell (4) in the closed position of the closure device (8) and in the open position of said closure device (8) protrudes beyond said front side (4.1).

4. The cover according to claim 3, characterized in that the locking piece (20) leaves a rear portion (10.1) of the closure recess (10) open in the locked position, wherein a stamping or projection is configured in the rear portion (10.1) to indicate an adjustment direction of the locking piece (20).

5. The cover (2) according to claim 3, characterized in that each closure device (8) further comprises a frame part (26), which is arranged as a coupling member between the cover shell (4) and the locking piece (20) and is connected to them respectively in an articulated manner.

6. The cover according to claim 5, characterized in that each closure device (8) comprises a spring device (24) for exerting a preload on the locking piece (20) in at least one of an open position and a locked position thereof.

7. The cover according to claim 6, characterized in that the spring device (24) is provided between the frame part (26) and the locking piece (20).

8. The cover according to claim 6, characterized in that the spring device (24) is provided between the frame part (26) and the locking piece (20) by means of said spring device being fixedly connected to the frame part (26) and abutting against the bottom side of the locking piece (20).

9. The cover according to claim 3, characterized in that each closure device (8) comprises an engagement device (22) for a positive locking engagement with the lower device part (3) in the locked position, wherein the engagement device when being adjusted into the locked position snaps into place while producing an acoustic sound.

10. The cover according to claim 9, characterized in that the engagement device is designed as a pivotable hook (22) and articulates with a coupling member (26).

11. The cover according to claim 9, characterized in that the engagement device is designed as a pivotable hook (22) and articulates with the frame part (26).

12. The cover according to claim 10, characterized in that the hook (22) is additionally guided on the locking piece (20) in order to provide guidance support and define a maximum pivoting range.

13. The cover according to claim 10, characterized in that the hook (22) is additionally guided in a slotted hole (36) of said locking piece (20) in order to provide guidance support and define a maximum pivoting range.

14. The cover according to claim 3, characterized in that the cover shell (4) is manufactured from a plastic material by means of an injection molding process.

15. The cover according to claim 3, characterized in that the carrying device (6) and two closure devices (8) are provided on a front side (4.5), said carrying device (6) being arranged between the closure devices (8).

16. A portable mixer amplifier (1), which comprises a cover (2) according to claim 3, and a lower device part (3), wherein the cover (2) covers the lower device part (3) in a positive locking manner and is locked to the same by means of locking devices (8), wherein the cover (2) comprises a carrying device (6) which allows a user to carry the device.

17. The portable mixer amplifier (1) according to claim 16, characterized in that the lower device part (3) comprises audio inputs for receiving different signal sources, an amplifier output for operating loud speakers as well operating devices for adjusting mixing effects.

18. The cover according to claim 3, characterized in that the locking piece (20) leaves a rear portion (10.1) of the closure recess (10) open in the locked position, wherein a stamping or projection in the form of an arrow (10.2) is configured in the rear portion (10.1) to indicate an adjustment direction of the locking piece (20).

19. A cover (2) for a portable electronic mixer amplifier (1), said cover (2) comprising at least: a cover shell (4) having a front side (4.1) and a rear side for being mounted on a lower device part (3) of the mixer amplifier (1), closure devices (8) for locking the cover (2) to the lower device part (3), wherein the closure devices (8) can be adjusted between an open and a locked position, characterized in that the cover (2) comprises a carrying device (6) which allows a user to carry the device, and the cover shell having therein closure recesses (10) in which the closure devices (8) are accommodated, and characterized in that the carrying device is designed as a handle (6) comprising a grip hole (6.1) and a graspable loop (6.8), wherein the cover shell (4) has a gripping region (6.2), which extends into the gripping loop (6.8) and surrounds the grip hole (6.1).

20. The cover (2) according to claim 19, characterized in that the handle (6) further comprises a handle shell (6.3), which is fastened as a separate component to the gripping region (6.2) of the cover shell (4), wherein a soft grip material part (6.4) is accommodated on at least one of the handle shell (6.3) and the gripping region (6.2) of the cover shell (4).

21. The cover (2) according to claim 19, characterized in that the handle (6) further comprises a handle shell (6.3), which is screwed on from below as a separate component to the gripping region (6.2) of the cover shell (4), wherein a rubber grip (6.4) is accommodated on at least one of the handle shell (6.3) and the inner region of the gripping loop (6.8).

* * * * *